(12) United States Patent
Prior

(10) Patent No.: US 7,095,123 B2
(45) Date of Patent: Aug. 22, 2006

(54) SENSOR SEMICONDUCTOR PACKAGE, PROVIDED WITH AN INSERT, AND METHOD FOR MAKING SAME

(75) Inventor: Christophe Prior, Le Versoud (FR)

(73) Assignee: STMicroelectronics SA, Montrouge (FR)

( * ) Notice: Subject to any disclaimer, the term of this patent is extended or adjusted under 35 U.S.C. 154(b) by 263 days.

(21) Appl. No.: 10/466,191

(22) PCT Filed: Jan. 10, 2002

(86) PCT No.: PCT/FR02/00069

§ 371 (c)(1),
(2), (4) Date: Nov. 10, 2003

(87) PCT Pub. No.: WO02/056388

PCT Pub. Date: Jul. 18, 2002

(65) Prior Publication Data

US 2004/0077118 A1     Apr. 22, 2004

(30) Foreign Application Priority Data

Jan. 15, 2001   (FR) .................................. 01 00473

(51) Int. Cl.
*H01L 23/28*     (2006.01)

(52) U.S. Cl. .............................. 257/787; 257/E23.129

(58) Field of Classification Search ................ 257/678, 257/680, 690, 734, 787
See application file for complete search history.

(56) References Cited

U.S. PATENT DOCUMENTS 5,534,725 A  *  7/1996  Hur .............................. 257/434

* cited by examiner

*Primary Examiner*—Scott B. Geyer
(74) *Attorney, Agent, or Firm*—Lisa K. Jorgenson; Allen, Dyer, Doppelt, Milbrath & Gilchrist, P.A.

(57) ABSTRACT

A semiconductor package includes a mounting and electrical connection plate, and a semiconductor component having front and rear surfaces and including a sensor. The rear surface of the semiconductor component is attached to the mounting and electrical connection plate and the front surface is attached to the sensor. An insert is adjacent the front face of the semiconductor component and the sensor and has an access passage for exposing the sensor. A plug is in the access passage of the insert. A body of encapsulation material surrounds the mounting and electrical connection plate, the semiconductor component and the insert.

18 Claims, 3 Drawing Sheets

SENSOR SEMICONDUCTOR PACKAGE, PROVIDED WITH AN INSERT, AND METHOD FOR MAKING SAME

FIELD OF THE INVENTION

The present invention relates to the field of semiconductor packages having a sensor, and in particular, to an optical, chemical or displacement sensor operating remotely or by contact.

BACKGROUND OF THE INVENTION

Semiconductor components having a sensor are generally mounted in packages that are externally accessible. In the majority of cases, these sensors need to be protected.

Semiconductor components with optical sensors are generally installed in the bottom cavity of their encapsulation packages. These encapsulation packages often have an attached lid made of a transparent material. The bottom wall of the encapsulation packages are used to make electrical connections external the semiconductor component. Such arrangements require a large number of fabrication steps, and are not multi-functional.

SUMMARY OF THE INVENTION

An object of the present invention is to improve and simplify semiconductor devices having a sensor, and to provide a corresponding method for fabricating such devices.

This and other objects, advantages and features in accordance with the present invention comprises placing in an injection mold cavity a semiconductor component, a rear face of which is attached to a front face of mounting and electrical connection means and a front face of which is attached to a sensor. The semiconductor component may further comprise an insert that includes an open passage in front of the sensor, and is provided with a plug for closing the open passage. The insert may have an end bearing on the front face of the component and around the sensor, and a front face bearing against a bottom of the cavity. The method may further comprise injecting an encapsulation material into the cavity for encapsulating the mounting and electrical connection means, and peripherally the semiconductor component and insert.

The method may further comprise placing an annular seal forming a spacer between the insert and the semiconductor component. The insert may be fitted with centering fins for centering the insert in the injection mold cavity, and the insert may be fitted with a plug installed in the passage thereof. The plug may be a transparent plug that is installed in the passage after demolding.

Another aspect of the present invention is directed to a semiconductor package obtained by implementing the above described method. The semiconductor package may comprise a semiconductor component, a rear face of which is attached to a front face of mounting and electrical connection means and a front face of which is attached to a sensor. The semiconductor package may further comprise an insert bearing on the front face of the optical component around the sensor, and includes an open passage in front of the sensor. A plug may be installed in the passage of the insert. The mounting and electrical connection means, the semiconductor component and the insert may be encapsulated with an encapsulation material.

The insert may bear on the front face of the optical component via an annular seal forming a spacer. The insert may advantageously be attached to the front face of the optical component by adhesive bonding. The plug may be transparent, and the plug may advantageously be integrated in the insert. The insert may comprise, in its front face, an annular groove.

The mounting and electrical connection means may comprise a gate having a platform or plate for mounting the semiconductor component, and electrical connection leads extending external the encapsulation material. The mounting and electrical connection means may comprise a mounting and electrical connection plate.

BRIEF DESCRIPTION OF THE DRAWING

The present invention will be better understood on studying semiconductor packages fitted with a sensor and their fabrication method, described by way of non-limiting examples and illustrated by the drawings in which.

DETAILED DESCRIPTION OF THE PREFERRED EMBODIMENTS

Figure 1:
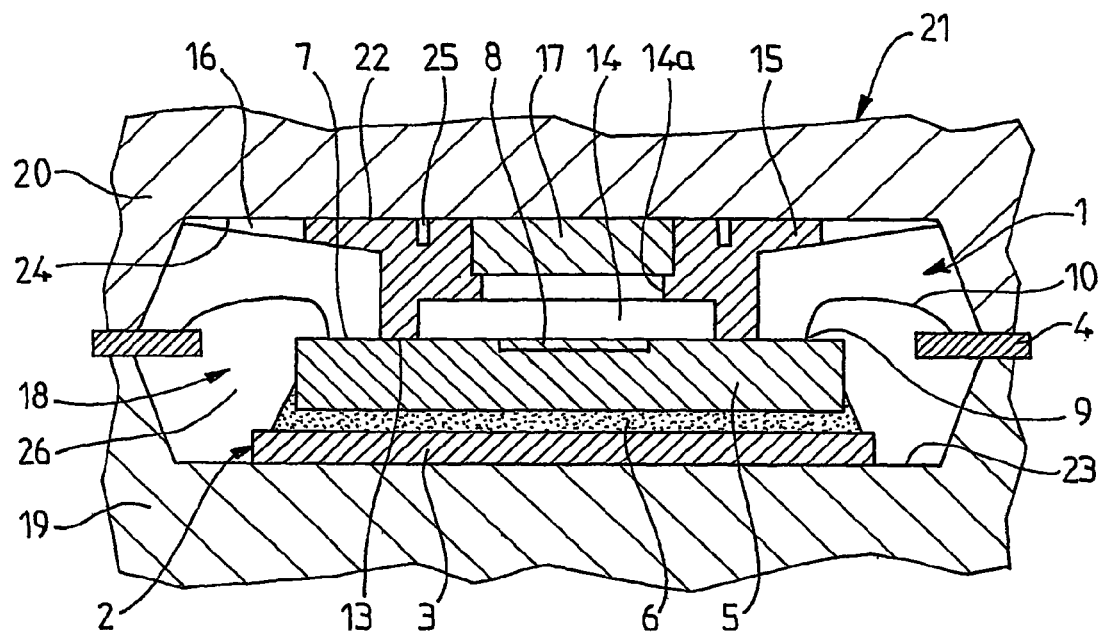
FIG. 1 is a cross-sectional view of a first embodiment of a semiconductor package being fabrication in accordance with the present invention.
Figure 2:
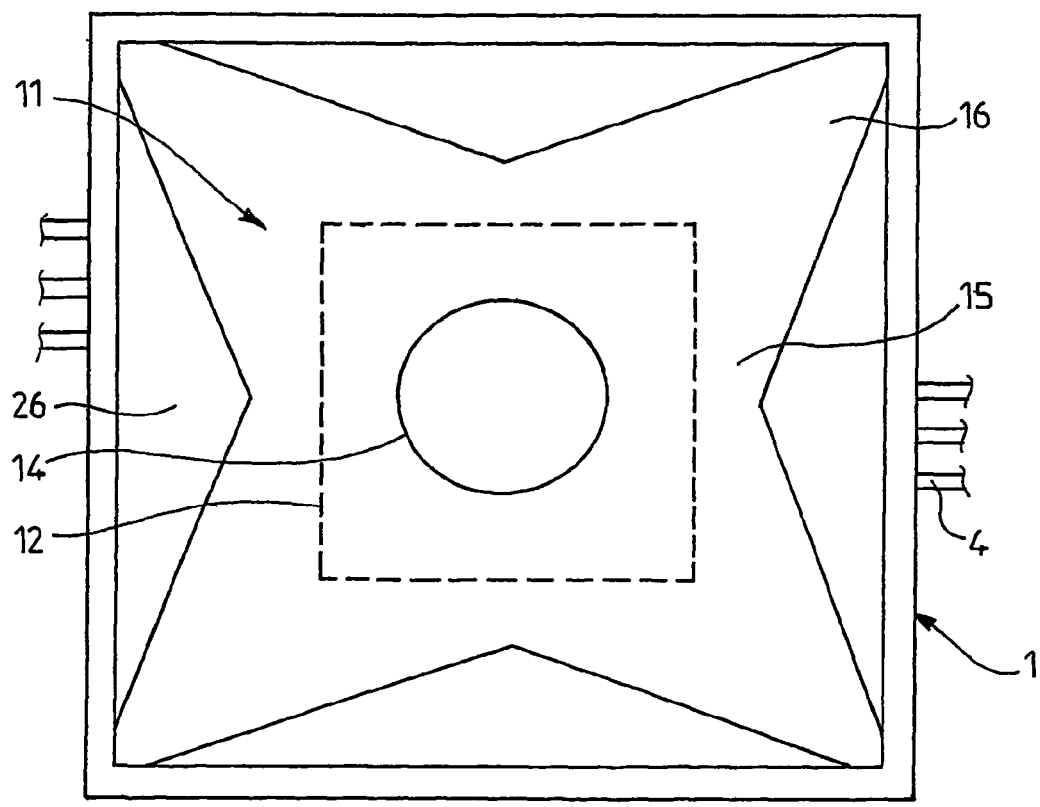
FIG. 2 is a top view of the semiconductor package illustrated in FIG. 1 after fabrication.
Figure 3:
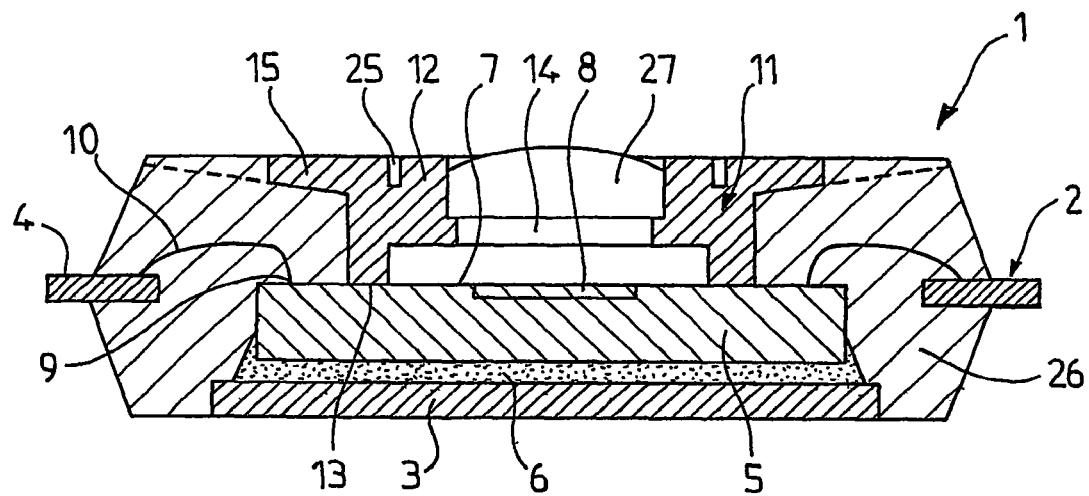
FIG. 3 is a cross-sectional view of the semiconductor package illustrated in FIG. 1 after fabrication.

With reference to FIGS. 1 to 3, a semiconductor package 1 comprises a metal gate 2 which has a central platform 3 and peripheral electrical connection leads 4. The rear face of a semiconductor component 5 is attached to the front face of the platform 3 via a layer of adhesive 6. This semiconductor component 5 has, in the central part of its front face 7, a sensor 8 such as an optical sensor, for example. At the periphery of this sensor 8 are electrical connection pads 9 which are selectively connected to the electrical connection leads 4 by metal wires 10.

In addition, the semiconductor package 1 comprises an insert 11 made of metal or plastic, for example, which has an annular body 12 placed perpendicularly to the semiconductor component 5. One end 13 of the insert 11 bears against the front face 7 of the semiconductor component 5 in its region lying between the sensor 8 and the pads 9. The insert 11 thus determines an access passage 14 opposite the sensor 8. The insert 11 has, at the periphery of its end opposite the semiconductor component 5, an annular cover 15 which is extended radially by four oppositely paired fins 16 and distributed at 90° around the body 12.

Having previously installed a plug 17 in the passage 14 of the insert 11, for example by screwing until the latter comes to bear against an annular shoulder 14a provided in the passage 14, the assembly described above is placed in the flat cavity 18 formed between a lower part 19 and an upper part 20 of an injection mold 21 as illustrated in FIG. 1 and as readily understood by those skilled in the art.

The rear face of the platform 3 of the gate 2, and the front face 22 of the insert 11 formed by the front face of the body 12, the front face of the cover 15 and the front face of the fins 16 are respectively in contact with the parallel bottoms 23 and 24 of the cavity 17. The parallel bottoms 23 and 24 are formed respectively in the lower part 19 and the upper part 20 of the mold 21. The front face of the plug 17 may also be in contact with the bottom 24.

The pads 4 of the gate 2 are held between the lower and upper parts 19 and 20 of the mold 21, and protrude into the cavity 18. The ends of the fins 16 are placed in the corners of the cavity 18 adjacent its bottom wall 24, and they position the insert 11 with respect to the semiconductor component 5. The distance between the bottoms 23 and 24 of the cavity 18 determines the pressing force of the rear face 13 of the insert 11 on the front face 7 of the semiconductor component 5. The front face 22 of the insert 11 has an annular groove 25.

In one variation, the rear face 13 of the insert 11 could be adhesively bonded to the front face 7 of the component 5. The layer of adhesive provides flexibility in positioning the insert 11 in the cavity 18, and control of the pressing force of the insert 11 on the component 5. In another variation, the cover 15 and the fins 16 could be omitted.

The injection of an encapsulation material 26 into the cavity 18 of the mold 21 is then undertaken to carry out an encapsulation operation, as readily understood by those skilled in the art. The encapsulation material 21 surrounding the platform 3 of the gate 2, the semiconductor component 5 and the insert 11 embeds the inner part of the leads 4 of the gate 2 and the wires 10.

By virtue of the insert 11 fitted with its plug 17, the passage 14 lying in front of the sensor 8 is protected against any introduction of encapsulation material during the injection operation. In addition, the annular groove 25 forms a reservoir in case of frontal seepage.

In the semiconductor package 1 being produced, it is then possible to remove the plug 17 to free the passage 14 so that the sensor 8 is then accessible from the outside. The sensor 8 may be an optical sensor, for example, as shown in FIG. 3. It is then possible to install a transparent protective plug 27, which could in addition form an optical lens in the passage 14 instead of the plug 17.

Figure 4:
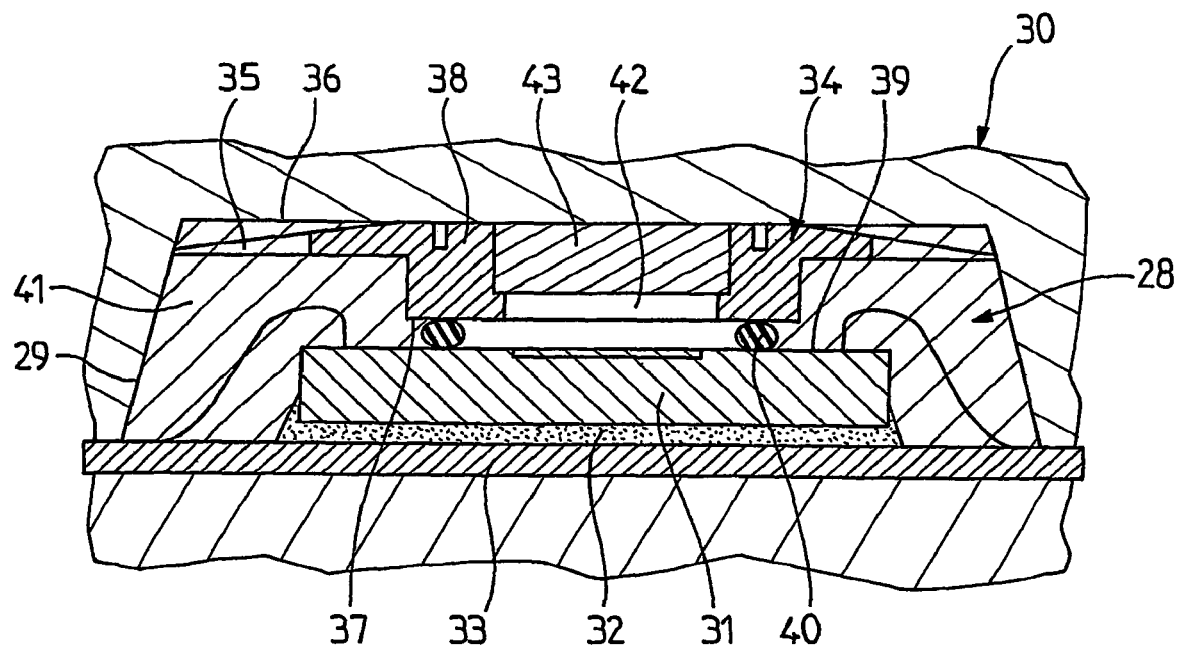
FIG. 4 is a cross-sectional view of a second embodiment of a semiconductor package being fabrication in accordance with the present invention.

With reference to FIG. 4, a semiconductor package 28 in the process of being fabricated is shown, which is placed in the cavity 29 of an injection mold 30. In this variation, the semiconductor component 31 is attached by a layer of adhesive 32 to the front face of a mounting and electrical connection plate 33.

The insert 34 is differentiated from the insert 11 of the previous example in that its fins 35 move away from the bottom 36 of the cavity 29 corresponding to the bottom 24 of the mold 21 of the previous example. The fins 35 come to rest in the corners of the cavity 29 at a distance from its bottom 36.

In addition, an annular seal 40 forming a spacer is inserted between the rear face 37 of the body 38 of the insert 34, corresponding to the rear face 13 of the insert 11 of the previous example, and the front face 39 of the semiconductor component 31. This seal 40 is preferably adhesively bonded against the face 37 and against the face 38, and provides a degree of flexibility in positioning the insert 34.

During injection of an encapsulation material 41 in the cavity 29 of the mold 28, as in the previous example, this encapsulation material is prevented from entering the passage 42 of the insert 34 by a plug 43 installed in this passage 42 and by the seal 40. The seal 40 also makes it possible to reduce and to control the pressing force of the insert 34 on the semiconductor component 31. In this variation, the fins 35 of the insert 34 are embedded in the encapsulation material 41.

Figure 5:
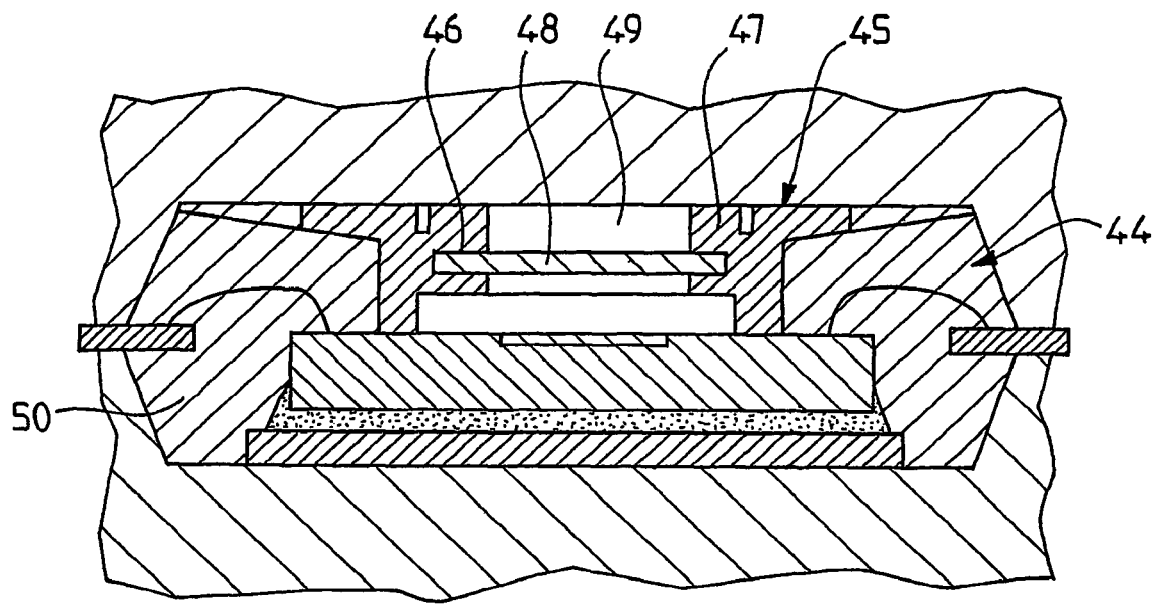
FIG. 5 is a cross-sectional view of a third embodiment of a semiconductor package being fabrication in accordance with the present invention.
Figure 6:
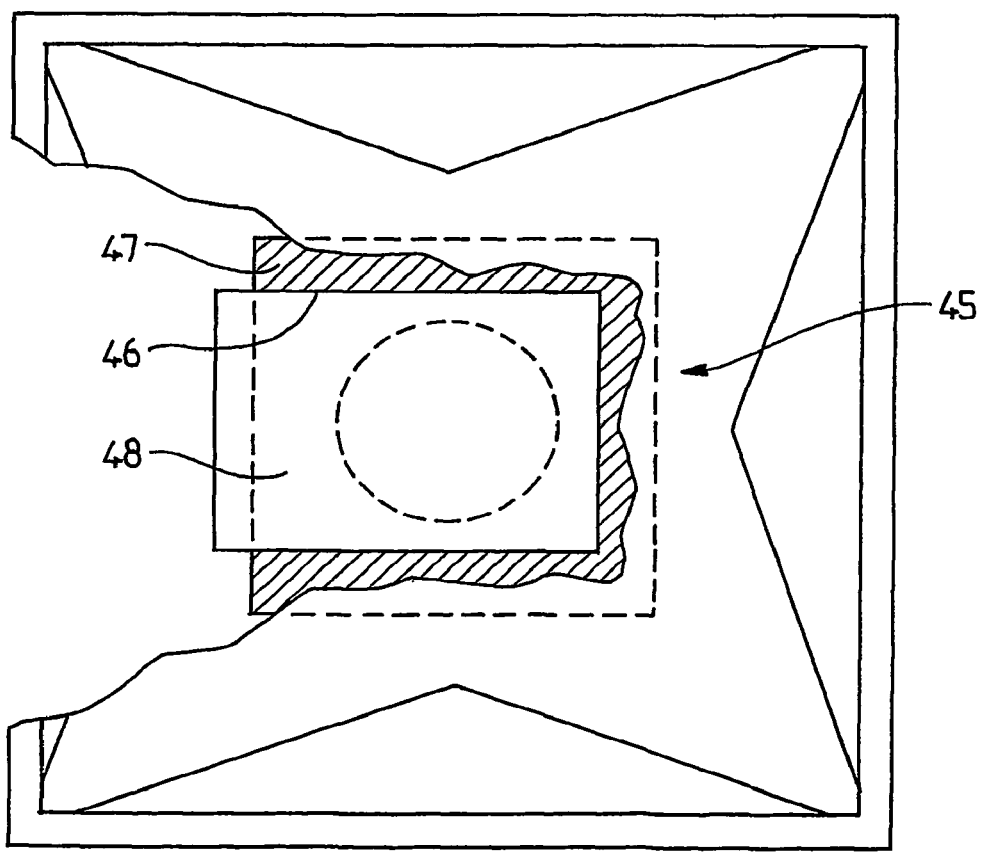
FIG. 6 is a top view, partially in cross-sectional, of the semiconductor package illustrated in FIG. 5 after fabrication.

With reference to FIGS. 5 and 6, a semiconductor package 44 is shown, which is only differentiated from the semiconductor package 1 described with reference to FIGS. 1 and 2 in that its insert 45 has a slot 46 made radially in its body 47 and open from one side. A plate 48, for example made of glass, is installed in the slot 46 of the insert 45 and forms a plug obstructing the passage 49 of this insert, thus replacing the plug 17 of the previous example. After injection of the encapsulation material, which is carried out in the same way as in the previous example, the plate 48, mounted in a sealed manner, is finally installed in the semiconductor package 44.

The present invention is not limited to the examples described above. Many embodiments are possible without departing from the scope defined by the appended claims.

The invention claimed is:

1. A semiconductor package comprising:
   a lead frame;
   a semiconductor component having front and rear surfaces and comprising a sensor, the rear surface being attached to said lead frame and the front surface being attached to said sensor;
   an insert adjacent the front face of said semiconductor component and said sensor, said insert having an access passage for exposing said sensor;
   a plug positioned within a portion of the access passage of said insert; and
   a body of encapsulation material surrounding said lead frame, said semiconductor component and said insert.

2. A semiconductor package according to claim 1, further comprising a seal for attaching said insert to the front face of said semiconductor component, said seal forming a spacer therebetween.

3. A semiconductor package according to claim 1, further comprising a layer of adhesive for attaching said insert to the front face of said semiconductor component.

4. A semiconductor package according to claim 1, wherein said plug is transparent.

5. A semiconductor package according to claim 1, wherein said insert has a slot in an outer surface thereof.

6. A semiconductor package according to claim 1, wherein said lead frame comprises:
   a platform for mounting said semiconductor component; and
   at least one electrical connection lead extending outwardly from said body of encapsulating material.

7. A semiconductor package according to claim 1, wherein said lead frame comprise a mounting and electrical connection plate.

8. A semiconductor package according to claim 7, wherein said body of encapsulating material extends at least in front of said plate.

9. A semiconductor package comprising:
   a mounting plate;
   a semiconductor component having front and rear surfaces and comprising a sensor, the rear surface attached to said mounting plate and the front surface attached to said sensor;

an insert spaced apart from the front face of said semiconductor component and said sensor, said insert having an access passage for exposing said sensor;

a plug positioned within a portion of the access passage of said insert;

a seal for attaching said insert to the front face of said semiconductor component and forming a spacer therebetween; and a body of encapsulation material surrounding said mounting plate, said semiconductor component and said insert.

10. A semiconductor package according to claim 9, wherein said plug is transparent.

11. A semiconductor package according to claim 9, wherein said insert has a slot in an outer surface thereof.

12. A semiconductor package according to claim 9, wherein said mounting plate comprises:

a platform for mounting said semiconductor component; and at least one electrical connection lead extending outwardly from said body of encapsulating material.

13. A semiconductor package comprising:

a mounting plate;

a semiconductor component having front and rear surfaces and comprising a sensor, the rear surface being attached to said mounting plate and the front surface being attached to said sensor;

an insert attached to the front face of said semiconductor component, said insert having an access passage for exposing said sensor;

a plug positioned within a portion of the access passage of said insert; and a body of encapsulation material surrounding said mounting plate, said semiconductor component and said insert.

14. A semiconductor package according to claim 13, wherein said plug is transparent.

15. A semiconductor package according to claim 13, wherein said insert has a slot in an outer surface thereof.

16. A semiconductor package according to claim 13, wherein said mounting plate comprises:

a platform for mounting said semiconductor component; and at least one electrical connection lead extending outwardly from said body of encapsulating material.

17. A semiconductor package according to claim 16, wherein said body of encapsulating material extends at least in front of said platform.

18. A semiconductor package according to claim 13, wherein said mounting plate comprises a mounting and electrical connection plate.

* * * * *